US008617329B2

(12) United States Patent
Lee et al.

(10) Patent No.: US 8,617,329 B2
(45) Date of Patent: Dec. 31, 2013

(54) METHOD OF FABRICATING ORGANIC LIGHT EMITTING DISPLAY

(75) Inventors: Jae-Ho Lee, Suwon-si (KR); Tae-Min Kang, Suwon-si (KR); Jin-Soo Kim, Yongin-si (KR); Seong-Taek Lee, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 1575 days.

(21) Appl. No.: 11/020,660

(22) Filed: Dec. 27, 2004

(65) Prior Publication Data

US 2006/0060297 A1     Mar. 23, 2006

(30) Foreign Application Priority Data

Sep. 23, 2004   (KR) ................. 10-2004-0076668

(51) Int. Cl.
  *B32B 37/00*      (2006.01)
  *B41J 2/447*      (2006.01)
(52) U.S. Cl.
  USPC ........ 156/60; 156/272.2; 156/272.8; 347/224; 347/238; 438/82
(58) Field of Classification Search
  USPC ...................... 327/238; 156/60, 272.2, 272.8; 347/224, 238; 438/82
  See application file for complete search history.

(56) References Cited

U.S. PATENT DOCUMENTS

| 5,061,049 | A | * | 10/1991 | Hornbeck ............... 359/224 |
| 5,652,672 | A | * | 7/1997 | Huignard et al. ......... 359/292 |
| 5,998,085 | A | | 12/1999 | Isberg et al. |
| 6,114,088 | A | | 9/2000 | Wolk et al. |
| 6,211,997 | B1 | * | 4/2001 | Nutt et al. .............. 359/290 |
| 6,214,520 | B1 | | 4/2001 | Wolk et al. |
| 6,458,504 | B2 | * | 10/2002 | Wachi et al. ............ 430/200 |
| 6,582,875 | B1 | | 6/2003 | Kay et al. |
| 6,838,038 | B2 | * | 1/2005 | Lovell et al. ............ 264/400 |
| 2002/0008091 | A1 | | 1/2002 | Brandinger et al. |
| 2003/0226834 | A1 | | 12/2003 | Ishikawa et al. |

FOREIGN PATENT DOCUMENTS

| CN | 1434523 | | 8/2003 |
| EP | 1 040 927 | A2 | 10/2000 |
| EP | 1 040 927 | A3 | 10/2000 |
| EP | 1 321 303 | A1 | 6/2003 |

(Continued)

OTHER PUBLICATIONS

English translation of the abstract of JP358072026, 1983, 2 pages.*

(Continued)

*Primary Examiner* — Justin Fischer
(74) *Attorney, Agent, or Firm* — H.C. Park & Associates, PLC

(57) ABSTRACT

Provided is a method of fabricating an organic light emitting display. The method includes forming an organic layer pattern on a substrate by irradiating a predetermined region of a donor substrate with a laser beam using a laser irradiation apparatus, the laser irradiation apparatus having a spatial light modulator (SLM). The spatial light modulator is used to form the organic layer pattern using the LITI method. Accordingly, it is possible to adjust various types of incident light to homogeneous and to have a desired profile. Therefore, there is provided a method of fabricating an organic light emitting display which is capable of forming an organic layer pattern without using a mask.

14 Claims, 4 Drawing Sheets

(56) References Cited

FOREIGN PATENT DOCUMENTS

| | | | |
|---|---|---|---|
| JP | 58072026 | * | 4/1983 |
| JP | 2000075406 | | 3/2000 |
| JP | 2003243168 | | 8/2003 |
| KR | 2001-72946 | | 7/2001 |
| KR | 10-2003-0023559 | | 3/2003 |
| KR | 10-2003-0064625 | | 8/2003 |
| KR | 10-2004-15717 | | 2/2004 |

OTHER PUBLICATIONS

Chinese Office Action dated Feb. 1, 2008.
European Search Report dated Dec. 28, 2005.

* cited by examiner

METHOD OF FABRICATING ORGANIC LIGHT EMITTING DISPLAY

CROSS-REFERENCE TO RELATED APPLICATION

This application claims priority to and the benefit of Korean Patent Application No. 2004-0076668, filed Sep. 23, 2004, the disclosure of which is incorporated herein by reference in its entirety.

BACKGROUND OF THE INVENTION

1. Field of the Invention

The present invention relates to a method of fabricating an organic light emitting display and, more particularly, to a method of forming an organic layer pattern using a laser irradiation apparatus with a spatial light modulator when forming the organic layer pattern using a laser induced thermal imaging (LITI) method.

2. Description of the Related Art

In general, an organic light emitting display, which is a flat panel display, includes an anode electrode, a cathode electrode, and organic layers between the anode electrode and the cathode electrode. The organic layers include at least an emission layer. The organic layers may further include a hole injection layer, a hole transport layer, an electron transport layer, and an electron injection layer, in addition to the emission layer. The organic light emitting display may be classified into a polymer organic light emitting display and a small molecule organic light emitting display depending on the organic layer, particularly, a material that forms the emission layer.

In order to implement full color in the organic light emitting display, it is required to pattern the emission layer. A method of patterning the emission layer includes a method using a shadow mask in the small molecule organic light emitting display, and an ink-jet printing method or a laser induced thermal imaging (hereinafter, referred to as LITI) method in the polymer organic light emitting display. With the LITI method, it possible to finely pattern the organic layer. The LITI method is usable for a large-sized display and is advantage in high resolution. Advantageously, the LITI method is a dry process, unlike the ink-jet printing that is a wet process.

The method of forming the organic layer pattern using such an LITI method needs at least a laser generator, an organic light emitting display substrate, and a donor substrate. A laser beam from the laser generator is absorbed by a light-to-heat conversion layer of the donor substrate and is converted to thermal energy, which allows a material forming a transfer layer to be transferred onto the substrate, thus patterning the organic layer on the substrate. This is disclosed in Korean Patent Application No. 1998-51844 and U.S. Pat. Nos. 5,998, 085, 6,214,520 and 6,114,088.

In order to form the organic layer pattern, it is required to homogeneously adjust the laser beam, namely, incident light and to pattern the organic layer into a desired shape. For these reasons, a beam homogenizer such as Fresnel lens is used. In this case, however, the beam homogenizer works only for a prescribed type of incident light, not for other various types of incident light.

SUMMARY OF THE INVENTION

The present invention, therefore, solves aforementioned problems associated with conventional devices by providing a method of fabricating an organic light emitting display, which is capable of forming an organic layer pattern by adjusting various types of incident light to be homogeneous and to have a desired profile using a spatial light modulator (SLM) when forming the organic layer pattern using a laser induced thermal imaging (LITI) method.

In an exemplary embodiment according to the present invention, a method of fabricating an organic light emitting display includes: providing a substrate having a pixel electrode formed thereon; laminating a donor substrate on the entire surface of the substrate; and forming an organic layer pattern on the substrate by irradiating a predetermined region of the donor substrate with a laser beam using a laser irradiation apparatus, the laser irradiation apparatus having a spatial light modulator (SLM). Accordingly, it is possible to form an organic layer pattern by adjusting various types of incident light to be homogeneous and to have a desired profile.

The spatial light modulator may be an array of at least two spatial light modulators.

Alternatively, the spatial light modulator may be a digital micromirror device (DMD) type spatial light modulator or an array of at least two DMD type spatial light modulators.

The laser irradiation apparatus may include a laser generator; a spatial light modulator positioned under the laser generator for modulating an incident laser beam generated by the laser generator; and a projection lens positioned under the spatial light modulator. The laser generator may be an array of at least two laser generators.

The incident laser beam generated by the laser generator may be a Gaussian beam profile.

The laser generator may be a laser diode or an array of at least two laser diodes.

Forming the organic layer pattern on the pixel electrode may be performed under an $N_2$ atmosphere or a vacuum atmosphere.

The formed organic layer pattern may be a single layer or a multi-layer of at least two layers selected from a group consisting of an emission layer, a hole injection layer, a hole transport layer, an electron transport layer, and an electron injection layer.

BRIEF DESCRIPTION OF THE DRAWINGS

The above and other features of the present invention will be described in conjunction with certain exemplary embodiments thereof with reference to the attached drawings in which.

DETAILED DESCRIPTION

Hereinafter, preferred embodiments according to the present invention will be described with reference to the accompanying drawings. However, the present invention is not limited to the illustrated embodiments and may be embodied into other forms.

Figure 1:
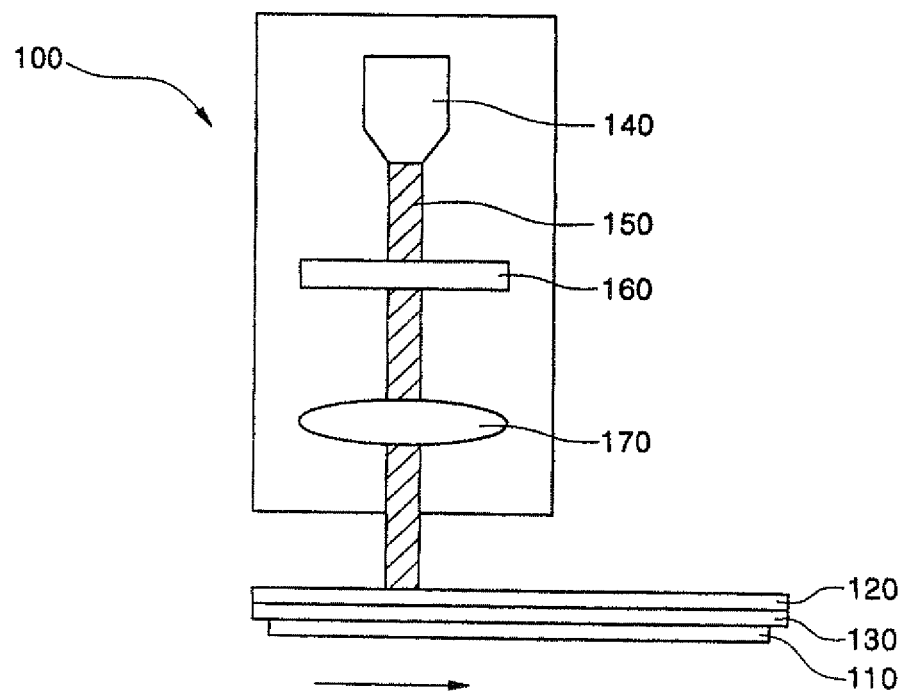
FIG. 1 is a schematic diagram illustrating a method of fabricating an organic light emitting display according to the present invention.

FIG. 1 is a schematic diagram illustrating a method of fabricating an organic light emitting display according to the present invention.

Referring to FIG. 1, a substrate 110 having a pixel electrode formed thereon is provided. Subsequently, a donor substrate 120 having an organic layer 130 is laminated on the substrate 110 having the pixel electrode. The donor substrate 120 having the organic layer 130 is laminated on the substrate 110 by vacuum adsorption, a pressing roller, or the like.

Subsequently, a laser irradiation apparatus 100 having a spatial light modulator irradiates the donor substrate 120 with laser beam 150 to form an organic layer pattern on the substrate 110 having the pixel electrode.

The formation of the organic layer pattern may be achieved under an $N_2$ atmosphere. The organic layer pattern, which will be transferred, may be oxidized due to an oxygen component in air. For this reason, a process of transferring the organic layer pattern may be carried out under a nitrogen atmosphere containing no oxygen component. Alternatively, the transferring process may be carried out under a vacuum atmosphere, thereby suppressing creation of bubble between the donor substrate and the substrate upon the forgoing laminating process.

The organic layer pattern, to be formed in the transfer process, may be a single layer or a multi-layer of at least two layers selected from a group consisting of an emission layer, a hole injection layer, a hole transport layer, an electron transport layer, and an electron injection layer.

The laser irradiation apparatus 100 includes a laser generator 140, a spatial light modulator 160, and a projection lens 170. The spatial light modulator 160 is positioned under the laser generator 140. The spatial light modulator 160 modulates a laser beam from the laser generator to adjust the laser beam to be homogeneous and to have a desired profile. The laser beam 150, which is modulated by the spatial light modulator 160, is refracted at the projection lens 170 that is formed under the spatial light modulator 160, and is irradiated onto the donor substrate 110, thereby forming the organic layer pattern on the substrate 110.

Specifically, of the spatial light modulator 160 is variously applied in the fields of optical information processing, projection displays, video and graphic monitors, televisions, and electronic photograph graphic printing. The spatial light modulator 160 is a device for modulating incident light into a spatial pattern to form homogeneous light that corresponds to an electrical or optical input. The incident light may be modulated in its phase, intensity, polarization, or direction. Optical modulation is accomplished by various materials exhibiting various electrical-to-optical or magnetic-to-optical conversion effects or a material that modulates light using surface deformation.

Currently, the spatial light modulator 160 is being primarily used in the form of liquid crystal, optical refraction, magneto-optical, a deformable mirror device, and the like.

Figure 2:
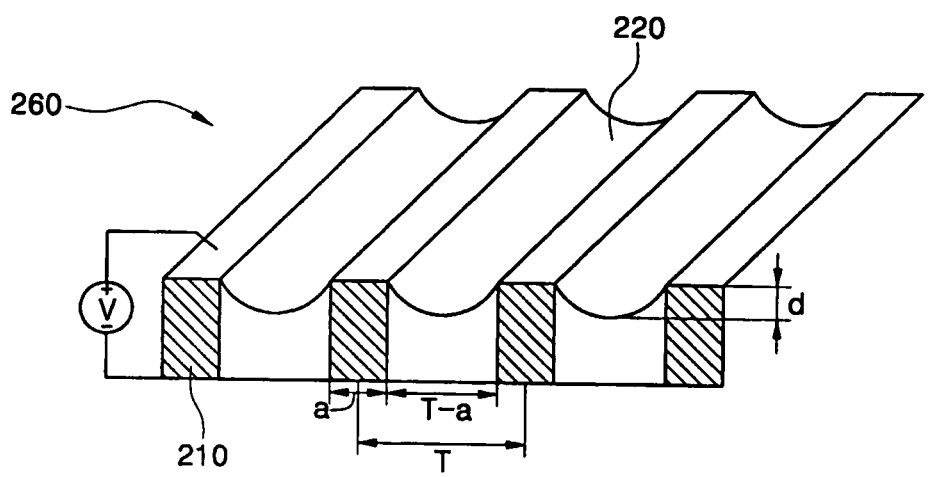
FIG. 2 is a schematic diagram illustrating modulation in a spatial light modulator according to the present invention.
Figure 3:
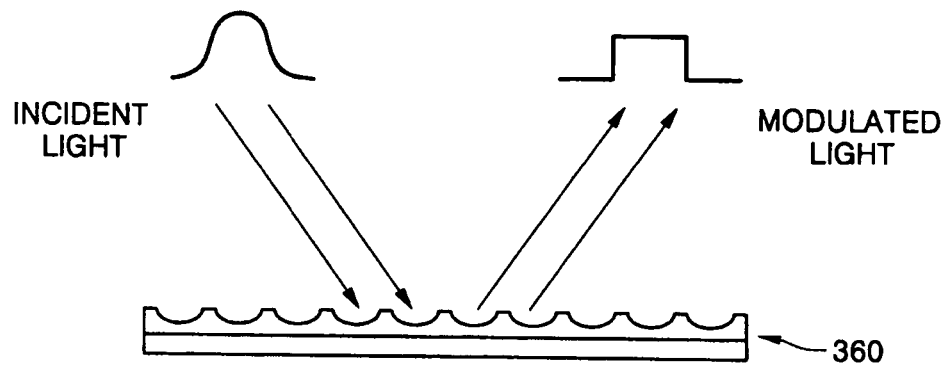
FIG. 3 is a schematic diagram illustrating homogenization of a laser beam obtained by modulation in a spatial light modulator according to the present invention.

FIG. 2 is a schematic diagram illustrating modulation in a spatial light modulator, and FIG. 3 is a schematic diagram illustrating homogenization of a laser beam obtained by modulation in a spatial light modulator according to the present invention.

Referring to FIG. 2, a diffraction lattice 210 in the spatial light modulator 260 is formed in a pillar shape, and is supplied with voltage. T indicates a distance between the diffraction lattices, a indicates a width of each diffraction lattice, and d indicates a depth of a reflection surface.

The application of the voltage to the diffraction lattice 210 deforms a material that forms the reflection surface 220. Deformed shape and depth (d) of the reflection surface determines reflection efficiency of the incident light. That is, the application of high voltage to the diffraction lattice 210 increases the depth (d) of the reflection surface, thereby degrading the reflection efficiency of the incident light. On the contrary, the application of low voltage decreases the depth (d) of the reflection surface, thereby enhancing the reflection efficiency of the incident light. Non-application of voltage to the diffraction lattice 210 causes total reflection.

Accordingly, it is possible to homogeneously modulate the incident light by controlling the reflection efficiency of the incident light through adjustment of the size of voltage applied to the diffraction lattice 210.

Further, it is possible to control the reflection efficiency of the incident light by adjusting a difference (T−a) between the spacing (T) between the diffraction lattices and the width (a) of the diffraction lattice. That is, it is possible to control the reflection efficiency of the incident light using the fact that if the difference (T−a) between the spacing (T) between the diffraction lattices and the width (a) of the diffraction lattice increases, the depth (d) of the reflection surface decreases and, on the contrary, if the difference (T−a) between the spacing (T) between the diffraction lattices and the width (a) of the diffraction lattice decreases, the depth (d) of the reflection surface increases.

The spatial light modulator may be an array of at least two spatial light modulators, thereby modulating the incident light more efficiently.

Likewise, the laser generator may be an array of at least two laser generators, thereby modulating a great amount of incident light.

Although the reflection surface 220 of the wave shape has been illustrated in FIG. 2, it is not limited to the wave shape but may take various deformed shapes.

Referring to FIG. 3, a Gaussian laser beam as incident light is irradiated onto a spatial light modulator 360. The Gaussian laser beam is a laser beam having high energy at its center portion and increasingly lower energy toward a peripheral portion.

When the Gaussian light is irradiated onto the spatial light modulator 360, it is modulated by the principle as described in FIG. 2. From FIG. 3, it can be seen that the modulated light is homogeneous.

Figure 4:
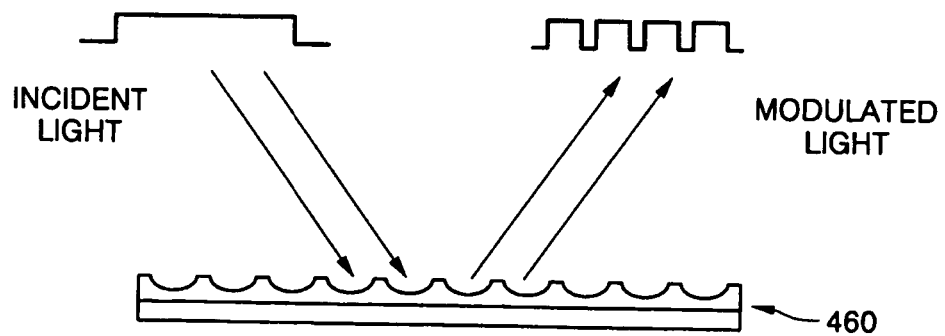
FIG. 4 is a schematic diagram illustrating a beam profile of a laser beam obtained by modulation in a digital micromirror device (DMD) type spatial light modulator according to the present invention.

FIG. 4 is a schematic diagram illustrating a beam profile of a laser beam obtained by modulation in a digital micromirror device (DMD) type spatial light modulator according to the present invention.

Referring to FIG. 4, the digital micromirror device 460 is a type of the spatial light modulator. It is a spatial light modulator composed of a high-density array of mobile micromirrors (not shown). The digital micromirror device 460 may be an array of at least two digital micromirror device type spatial light modulators (hereinafter, referred to as DMDs), thereby modulating the incident light efficiently.

The incident light is a homogeneous laser beam and enters the DMD to be modulated into a laser beam having a spherical wave profile.

Specifically, each of the micromirrors forms one cell in the DMD array and is bistable. In other words, the micromirror is stable at one of two positions. The incident light is irradiated onto the array of micromirrors and is reflected in one of two directions by the micromirrors. The light entering the micromirror is reflected at any stable "on" mirror position to the projection lens and is focused on the donor substrate. The incident light, irradiated onto the micromirror, is reflected at another "off" mirror position to an optical absorber (not shown). The respective mirrors in the array are controlled individually to directly irradiate the incident light onto the projection lens or the optical absorber.

It can be seen that the incident light at the "on" mirror position is modulated by constructive interference to have a pulse-wave profile while the incident light at the "off" mirror position disappears due to destructive interference, thus obtaining a modulated laser beam with a generally spherical wave profile.

Although in this embodiment, it has been illustrated that the incident light is modulated into the laser beam having the spherical wave profile, it may be modulated to have a desired profile through adjustment of a shape into which a material forming the reflection surface is deformed, a depth of the reflection surface, or the like, as illustrated in FIG. 1.

Figure 5:
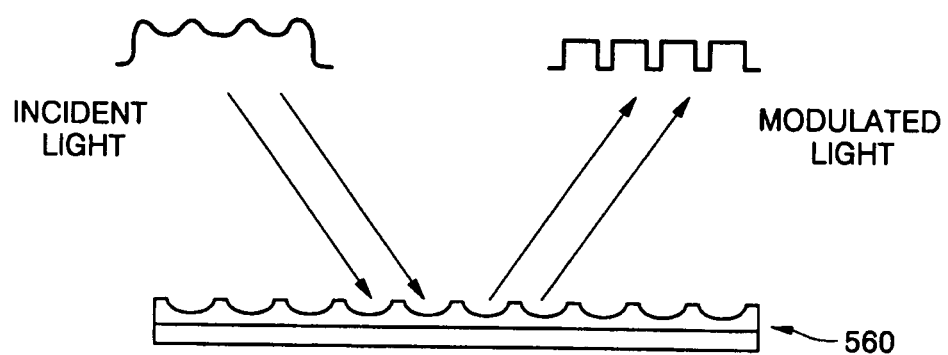
FIG. 5 is a schematic diagram illustrating a beam profile obtained by modulation by a digital micromirror device type spatial light modulator of a laser beam generated in a laser diode according to the present invention.

FIG. 5 is a schematic diagram illustrating a beam profile obtained by modulation by a digital micromirror device type spatial light modulator of a laser beam generated in a laser diode according to the present invention.

Referring to FIG. 5, in this embodiment, a laser diode (not shown) is used as the laser generator. The laser diode may be an array of at least two laser diodes. From FIG. 5, it can be seen that incident light generated by the laser diode array is a non-uniform laser beam. The light is irradiated onto the DMD 560 and is modulated to have a spherical wave profile.

Except for the foregoing, other descriptions are the same as that illustrated in conjunction with FIG. 4.

As described above, the organic layer pattern was formed on the substrate, which has the pixel electrode formed thereon, by irradiating the modulated laser beam onto the donor substrate using the laser irradiation apparatus having the spatial light modulator.

A cathode is formed on the organic layer pattern following the transferring process of forming the organic layer pattern, thus completing an organic light emitting display.

As described above, according to the present invention, the spatial light modulator is used in forming the organic layer pattern using the LITI method. Accordingly, it is possible to adjust various types of incident light to be homogeneous and to form a laser beam with a desired profile. Therefore, there is provided a method of fabricating an organic light emitting display which is capable of forming an organic layer pattern without using a mask.

Although the present invention has been described with reference to preferred embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating an organic light emitting display, comprising:
   providing a substrate having a pixel electrode formed thereon;
   laminating a donor substrate on an entire surface of the substrate; and
   forming an organic layer pattern on the substrate by irradiating a predetermined region of the donor substrate with a homogenous laser beam using a laser irradiation apparatus, the laser irradiation apparatus having a spatial light modulator (SLM) to provide the homogenous laser beam,
   wherein the SLM adjusts various types of incident light, using a reflection surface having a deformed shape, to output the homogeneous laser beam,
   wherein the SLM comprises a plurality of diffraction lattices formed in a pillar shape, the reflection surface being arranged between the plurality of diffraction lattices, and
   wherein a voltage applied to the diffraction lattices deforms the reflection surface so that a depth of the reflection surface from a surface of an adjacent diffraction lattice changes.

2. The method according to claim 1, wherein the spatial light modulator is an array of at least two spatial light modulators.

3. The method according to claim 1, wherein the spatial light modulator is an array of at least two DMD type spatial light modulators.

4. The method according to claim 3, wherein the DMD type spatial light modulator is an array of at least two DMD type spatial light modulators.

5. The method according to claim 1, wherein the laser irradiation apparatus comprises:
   a laser generator;
   a spatial light modulator positioned under the laser generator for modulating an incident laser beam generated by the laser generator; and
   a projection lens positioned under the spatial light modulator.

6. The method according to claim 5, wherein the laser generator is an array of at least two laser generators.

7. The method according to claim 5, wherein the incident laser beam generated by the laser generator has a Gaussian beam profile.

8. The method according to claim 5, wherein the laser generator is a laser diode.

9. The method according to claim 8, wherein the laser diode is an array of at least two laser diodes.

10. The method according to claim 1, wherein forming the organic layer pattern on the pixel electrode is performed under an $N_2$ atmosphere.

11. The method according to claim 1, wherein forming the organic layer pattern on the pixel electrode is performed under a vacuum atmosphere.

12. The method according to claim 1, wherein the organic layer pattern is a single layer or a multi-layer of at least two layers selected from a group consisting of an emission layer, a hole injection layer, a hole transport layer, an electron transport layer, and an electron injection layer.

13. The method according to claim 1, wherein the depth of the reflection surface increases, as the voltage applied to the diffraction lattices is higher.

14. The method according to claim 1, wherein the depth of the reflection surface decreases, as the voltage applied to the diffraction lattices is lower.

* * * * *